United States Patent
Ye et al.

(10) Patent No.: US 10,622,481 B2
(45) Date of Patent: Apr. 14, 2020

(54) METHOD OF ROUNDING CORNERS OF A FIN

(71) Applicant: UNITED MICROELECTRONICS CORP., Hsin-Chu (TW)

(72) Inventors: Yi-Liang Ye, Kaohsiung (TW); Chun-Wei Yu, Tainan (TW); Yu-Ren Wang, Tainan (TW); Hao-Hsuan Chang, Kaohsiung (TW); Chia-Wei Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/056,540

(22) Filed: Aug. 7, 2018

(65) Prior Publication Data
US 2020/0052123 A1    Feb. 13, 2020

(51) Int. Cl.
| | | |
|---|---|---|
| *H01L 29/78* | (2006.01) | |
| *H01L 29/06* | (2006.01) | |
| *H01L 21/762* | (2006.01) | |
| *H01L 21/02* | (2006.01) | |
| *H01L 21/324* | (2006.01) | |
| *H01L 29/66* | (2006.01) | |

(52) U.S. Cl.
CPC .... *H01L 29/7854* (2013.01); *H01L 21/02164* (2013.01); *H01L 21/02225* (2013.01); *H01L 21/3247* (2013.01); *H01L 21/76224* (2013.01); *H01L 29/0649* (2013.01); *H01L 29/66795* (2013.01); *H01L 29/7851* (2013.01)

(58) Field of Classification Search
CPC ............. H01L 29/7854; H01L 21/3247; H01L 21/823431; H01L 21/823821
See application file for complete search history.

(56) References Cited

U.S. PATENT DOCUMENTS

| | | | |
|---|---|---|---|
| 8,853,013 B2* | 10/2014 | Tsai | H01L 29/7854 438/151 |
| 9,117,906 B2 | 8/2015 | Fumitake | |
| 2005/0153490 A1* | 7/2005 | Yoon | H01L 21/84 438/164 |
| 2009/0269916 A1* | 10/2009 | Kang | H01L 27/11568 438/587 |
| 2016/0315014 A1* | 10/2016 | Chou | H01L 21/823481 |

* cited by examiner

*Primary Examiner* — Bilkis Jahan
*Assistant Examiner* — Victor V Barzykin
(74) *Attorney, Agent, or Firm* — Winston Hsu

(57) ABSTRACT

A method of rounding corners of a fin includes providing a substrate with a fin protruding from the substrate, wherein a pad oxide and a pad nitride entirely cover a top surface of the fin. Later, part of the pad oxide is removed laterally to expose part of the top surface of the fin. A silicon oxide layer is formed to contact two sidewalls of the fin and the exposed top surface, wherein two sidewalls and the top surface define two corners of the fin. After forming the silicon oxide layer, an annealing process is performed to round two corners of the fin. Finally, after the annealing process, an STI filling material is formed to cover the pad nitride, the pad oxide and the fin.

9 Claims, 5 Drawing Sheets

METHOD OF ROUNDING CORNERS OF A FIN

BACKGROUND OF THE INVENTION

1. Field of the Invention

The present invention relates to a method of rounding corners of a fin, and more particularly to a method of rounding corners using an annealing process.

2. Description of the Prior Art

As the semiconductor industry progresses into nanometer technology process nodes in the pursuit of higher device density, higher performance, and lower cost, challenges from both fabrication and design issues have resulted in the development of three-dimensional designs, such as a fin field effect transistor (FinFET). A typical FinFET is fabricated with a fin structure extending from a substrate formed by (for example) etching away a portion of a silicon layer of the substrate. The channel of the FinFET is formed in this fin structure and a provided gate structure wraps the fin.

There are challenges in forming the gate structure (including a gate electrode, a work function layer, and a gate dielectric layer) which wraps the fin structure with a uniform thickness because the fin structure has a sharp tip on its corner.

Accordingly, a method for fabricating a FinFET having a gate structure with a uniform thickness is needed.

SUMMARY OF THE INVENTION

According to a preferred embodiment of the present invention, a method of rounding corners of a fin includes providing a substrate with a fin protruding from the substrate, wherein a pad oxide and a pad nitride entirely cover a top surface of the fin. Later, part of the pad oxide is removed laterally to expose part of the top surface of the fin. A silicon oxide layer is formed to contact two sidewalls of the fin and the exposed top surface, wherein two sidewalls and the top surface define two corners of the fin. After forming the silicon oxide layer, an annealing process is performed to round two corners of the fin. Finally, after the annealing process, an STI filling material is formed to cover the pad nitride, the pad oxide and the fin.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 to 4 and FIG. 6 to FIG. 7 depict a method of rounding corners of a fin according to a first preferred embodiment of the present invention, wherein:

FIG. 1 depicts a substrate with numerous fins protruding thereon;
FIG. 2 is a fabricating stage following FIG. 1;
FIG. 3 is a fabricating stage following FIG. 2;
FIG. 4 is a fabricating stage following FIG. 3;
FIG. 6 is a fabricating stage following FIG. 4;
and
FIG. 7 is a fabricating stage following FIG. 6.

FIG. 8 to FIG. 9 depict a method of forming a gate structure on a fin with rounded corners, wherein:
FIG. 8 is a fabricating stage following FIG. 7;
and
FIG. 9 is a fabricating stage following FIG. 8.

DETAILED DESCRIPTION

Figure 8:
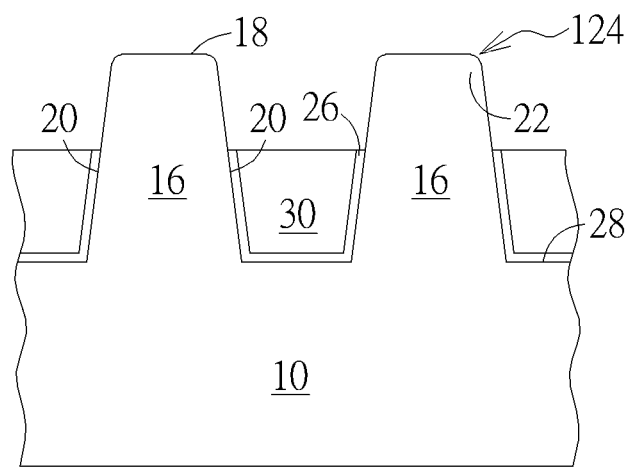
Figure 9:
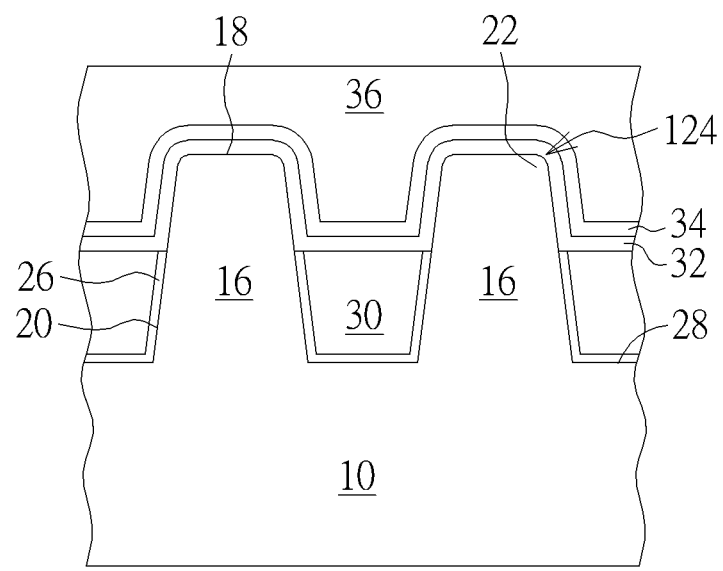
Figure 10:
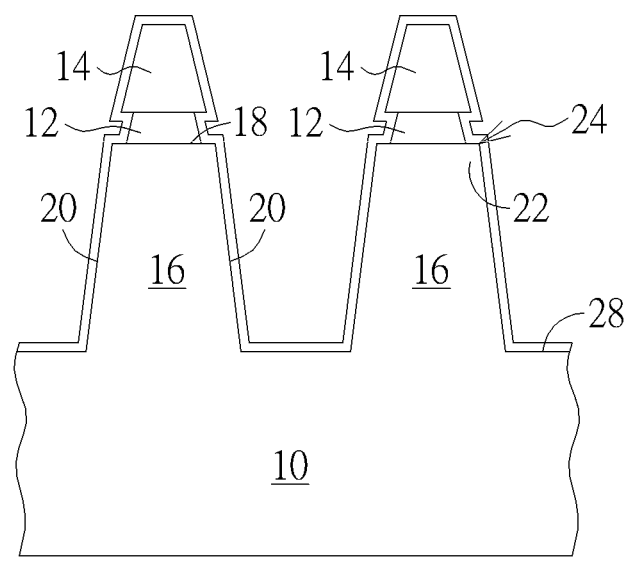
FIG. 10 depicts a method of rounding corners of a fin according to a second preferred embodiment of the present invention.

FIGS. 1 to 4 and FIG. 6 to FIG. 7 depict a method of rounding corners of a fin according to a first preferred embodiment of the present invention. FIG. 5 shows a magnified view of a corner of a fin shown in FIG. 4. FIG. 8 to FIG. 9 depict a method of forming a gate structure on a fin with rounded corners. FIG. 10 depicts a method of rounding corners of a fin according to a second preferred embodiment of the present invention.

Figure 1:
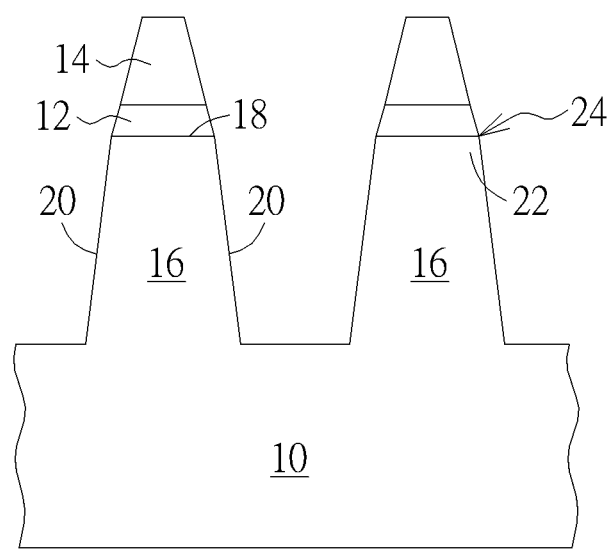

As shown in FIG. 1, a substrate 10 is provided. The substrate 10 may be a bulk silicon substrate, a germanium substrate, a gallium arsenide substrate, a silicon germanium substrate, an indium phosphide substrate, a gallium nitride substrate or a silicon carbide substrate. A pad oxide 12 and a pad nitride 14 cover the substrate 10. The pad oxide 12 is silicon oxide and the pad nitride 14 is silicon nitride. Later, the pad oxide 12 and the pad nitride 14 are patterned to form an etching mask. Next, the substrate 10 is etched by taking the etching mask as a mask to form numerous fins 16 protruding from the substrate 10. The fins 16 and the substrate 10 are formed as a single piece. The remaining pad oxide 12 and the remaining pad nitride 14 cover each of the fins 16. The pad oxide 12 contacts a top surface 18 of each of the fins 16, and the pad nitride 14 is on the pad oxide 12. More specifically, the pad oxide 12 covers the entire top surface 18 of each of the fins 16. Furthermore, each of the fins 16 has two sidewalls 20. The two sidewalls 20 and the top surface 18 of each fin 16 define two corners 22 of each of the fins 16. Each of the two corners 22 has a sharp tip 24.

Figure 2:
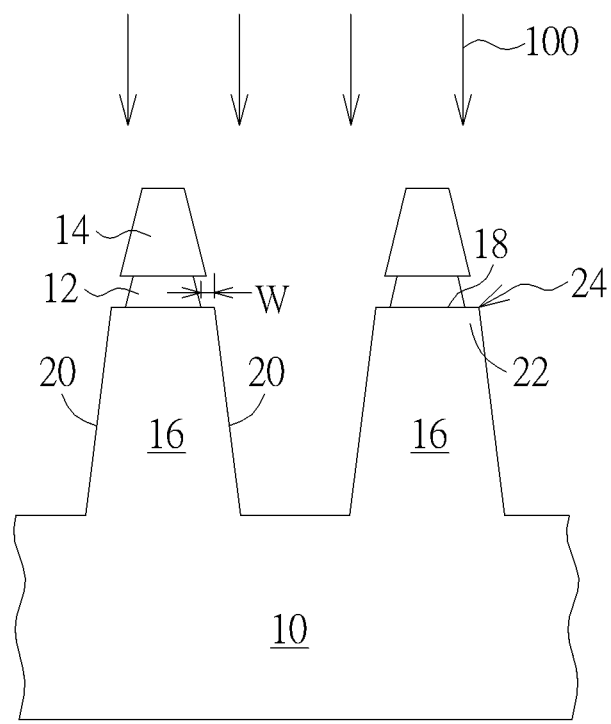

As shown in FIG. 2, part of the pad oxide 12 is removed laterally to expose part of the top surface 18 of each fin 16. In other words, the pad oxide 12 is thinned in a direction parallel to the top surface 18 of each fin 16. According to a preferred embodiment of the present invention, the pad oxide 12 which is removed has a width W between 20 and 40 angstroms. The pad oxide 12 can be removed by a wet etching process using diluted hydrofluoric acid as an etchant. The diluted hydrofluoric acid has a volume ratio of hydrofluoric acid to $H_2O$ equaling 1:100. After removing part of the pad oxide 12 laterally, a repairing annealing process 100 is optionally performed, wherein the repairing annealing process 100 is performed in a hydrogen environment to repair damages on a surface of the fins 16.

Figure 3:
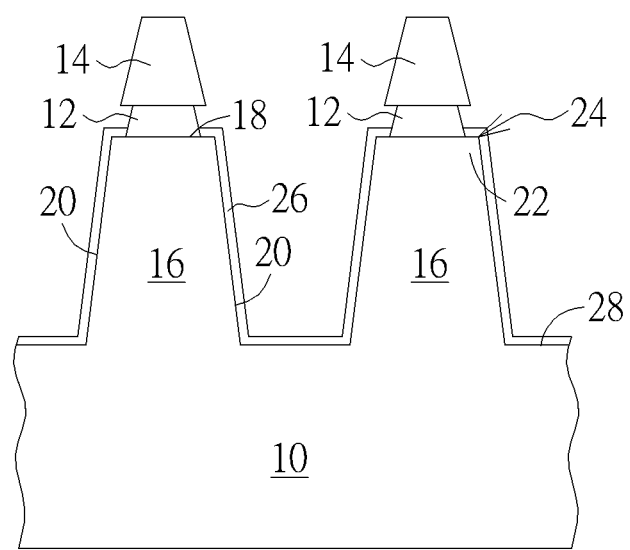

As shown in FIG. 3, an in-situ steam generation (ISSG) process is performed to form a silicon oxide layer 26 contacting two sidewalls 20 of each fin 16 and the exposed top surface 18. It is noteworthy that the two corners 22 of each fin 16 are both covered by the silicon oxide layer 26. The sidewalls 20 of each fin 16 and a top surface 28 of the substrate 10 are also covered by the silicon oxide layer 26. Moreover, in this embodiment, the pad nitride 14 is not covered by the silicon oxide layer 26, and only part of the pad oxide 12 is covered by the silicon oxide layer 26. A thickness of the silicon oxide layer 26 is preferably between 10 and 20 angstroms. According to a preferred embodiment, an operating temperature of the ISSG process is between 950° C. and 1150° C., an operating time of the ISSG process is between 10 and 13 seconds, and the ISSG process is performed in an environment with hydrogen (H$_2$) and nitrous oxide (N$_2$O).

According to a second preferred embodiment of the present invention, the silicon oxide layer 26 can be formed by an atomic layer deposition (ALD) as shown in FIG. 10. The silicon oxide layer 26 formed by the ALD not only covers the corners 22 and the sidewall 20 of each fin 16, but also covers the entire pad oxide 12 and the entire pad nitride 14 on each fin 16. In the following fabricating steps the silicon oxide layer 26 formed by the ISSG process is taken as an example.

Figure 4:
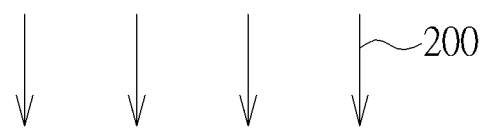
Figure 4:
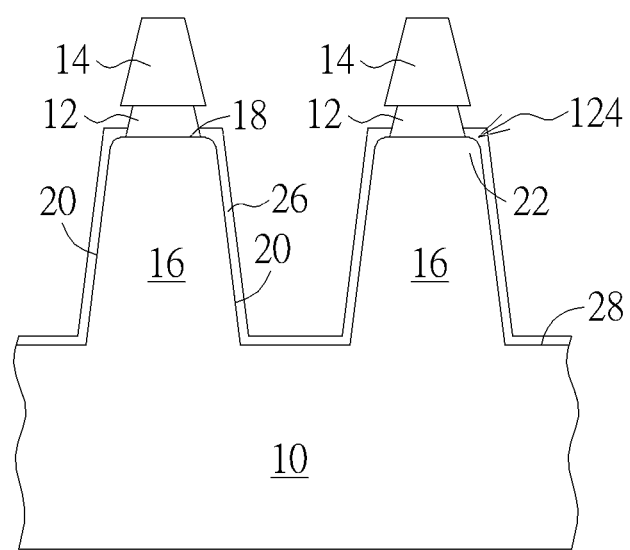
Figure 5:
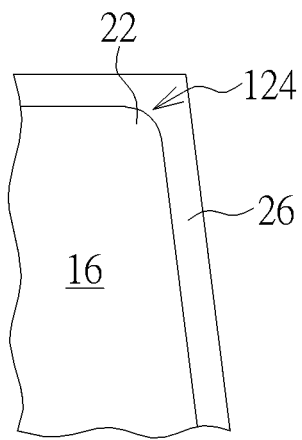
FIG. 5 shows a magnified view of a corner of a fin in FIG. 4.

As shown in FIG. 4 and FIG. 5, an annealing process 200 is performed to round two corners 22 of each fin 16. During the annealing process 200, the oxygen atoms in the silicon oxide layer 16 react with the corners 22 to round the sharp tips 24. After the annealing process 200, the corners 22 of each fin 16 respectively have a rounded angle 124. FIG. 5 shows a magnified view of one corner in FIG. 4. As shown in FIG. 5, the corner 22 has a rounded angle 124, and the silicon oxide layer 26 covering the rounded angle 124 becomes thicker than that in FIG. 3 because part of the corners 22 is transformed into the silicon oxide layer 26 during the annealing process 200. According to the preferred embodiment of the present invention, an operating temperature the annealing process 200 is between 950° C. and 1150° C., an operating time of the annealing process 200 is between 27 and 33 minutes, and the annealing process 200 is performed in an environment without oxygen (O$_2$) or without other gas containing oxygen atoms. Because the silicon oxide layer 26 can provide the oxygen atoms to react with the corners 22, there is no need to introduce oxygen or other gas containing oxygen atoms during the annealing process 200.

Figure 6:
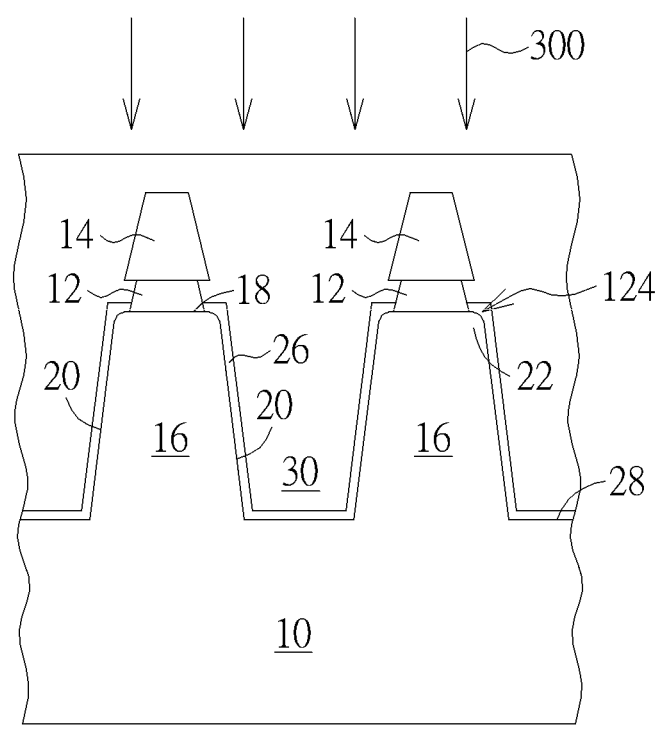

As shown in FIG. 6, an STI filling material 30 covers the pad oxide 12, the pad nitride 14, the silicon oxide layer 26, and the substrate 10. The STI filling material 30 surrounds each of the fins 16. The STI filling material 30 can be formed by a flowable chemical vapor deposition (FCVD), a chemical vapor deposition (CVD), a high density plasma chemical vapor deposition (HDPCVD) or a spin-on-dielectric (SOD) process. In this embodiment, the STI filling material 30 is preferably formed by the FCVD. After performing the FCVD, another annealing process 300 is performed to improve the density of the STI filling material 30.

Figure 7:
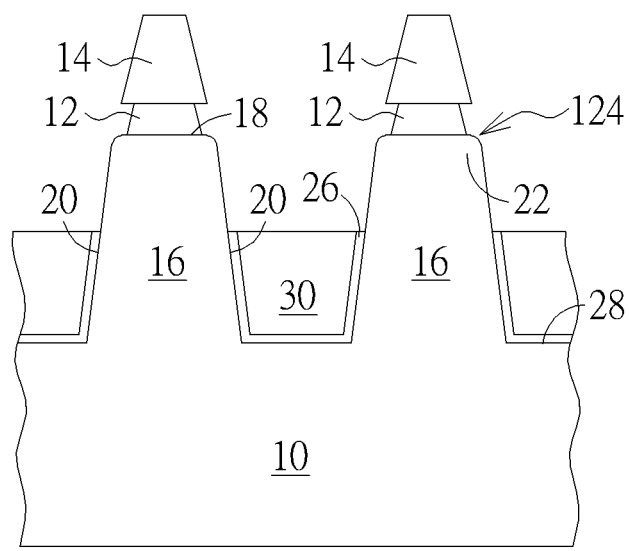

As shown in FIG. 7, the STI filling material 30 is planarized by taking the pad nitride 14 as a stop layer. Later, part of the STI filling material 30 and part of the silicon oxide layer 26 is etched back to expose the pad oxide 12, the pad nitride 14, and upper portion of each of the fins 16. Therefore, the corner 22 is exposed.

As shown in FIG. 8, the pad oxide 12 and the pad nitride 14 are removed entirely.

As shown in FIG. 9, agate structure including a gate electrode, a gate electric layer, and a work function layer can be formed by a gate-first process or a gate-last process to wrap the fins 16. For example, a gate dielectric layer 32, a work function layer 34 and a gate electrode 36 are formed to cross the fins. The gate dielectric layer 32 may be silicon oxide, silicon oxynitride (SiON), silicon nitride (Si$_3$N$_4$), tantalum oxide (Ta$_2$O$_5$), aluminum oxide (Al$_2$O$_5$), hafnium oxide (HfO$_2$), nitrogen-containing material, hafnium containing material, tantalum-containing material, aluminum containing material or high-k dielectrics, or any combination thereof. The work function layer 34 may be titanium nitride (TiN) or tantalum nitride (TaN). The gate electrode 36 may be polysilicon or metal. Because the corners 22 are rounded, the gate dielectric layer 32, the work function layer 34 and the gate electrode 36 respectively covering the fins 16 can have uniform thickness.

In the conventional process, the corners still have sharp tips, meaning electrical charges may accumulate at the sharp tips, leading to volcano defects around the corners after material is deposited thereon. The gate dielectric layer, the work function layer or the gate electrode deposited on the fin also will have a non-uniform thickness because of the sharp tips. By using the present invention method of rounding corners of a fin, the volcano defects and non-uniform thickness can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of rounding corners of a fin, comprising:
   providing a substrate with a fin protruding from the substrate, a pad oxide and a pad nitride entirely covering a top surface of the fin;
   removing part of the pad oxide laterally to expose part of the top surface of the fin;
   forming a silicon oxide layer contacting two sidewalls of the fin and the top surface which is exposed, wherein the two sidewalls and the top surface define two corners of the fin;
   after forming the silicon oxide layer, performing an annealing process to round two corners of the fin; and
   after the annealing process, forming an STI filling material covering the pad nitride, the pad oxide and the fin.

2. The method of rounding corners of a fin of claim 1, further comprising:
   after removing part of the pad oxide laterally and before forming the silicon oxide layer, performing a repairing annealing process, wherein the repairing annealing process is performed in a hydrogen environment to repair damages on a surface of the fin.

3. The method of rounding corners of a fin of claim 1, wherein an operating temperature of the annealing process is between 950° C. and 1150° C., an operating time of the annealing process is between 27 and 33 minutes, and the annealing process is performed in an environment without oxygen (O$_2$) or other gas containing oxygen atoms.

4. The method of rounding corners of a fin of claim 1, wherein the silicon oxide layer is formed by an in-situ steam generation (ISSG) process, an operating temperature of the ISSG process is between 950° C. and 1150° C., an operating time of the ISSG process is between 10 and 13 seconds, and the ISSG process is performed in an environment with hydrogen (H$_2$) and nitrous oxide (N$_2$O).

5. The method of rounding corners of a fin of claim 1, wherein a thickness of the silicon oxide layer is between 10 and 20 angstroms.

6. The method of rounding corners of a fin of claim 1, wherein the pad oxide is removed by diluted hydrofluoric acid in which a volume ratio of hydrofluoric acid to H$_2$O is 1:100.

7. The method of rounding corners of a fin of claim 1, wherein the part of the pad oxide which is removed has a width between 20 and 40 angstroms.

8. The method of rounding corners of a fin of claim 1, wherein the silicon oxide layer is formed by an atomic layer deposition process.

9. The method of rounding corners of a fin of claim 1, wherein before the annealing process, each of the corners has a sharp tip.

* * * * *